(12) United States Patent
Kumar et al.

(10) Patent No.: US 10,404,278 B2
(45) Date of Patent: Sep. 3, 2019

(54) PARALLEL PIPELINE LOGIC CIRCUIT FOR GENERATING CRC VALUES UTILIZING LOOKUP TABLE

(71) Applicant: STMicroelectronics International N.V., Amsterdam (NL)

(72) Inventors: Tejinder Kumar, Moga (IN); Rakesh Malik, Noida (IN)

(73) Assignee: STMicroelectronics International N.V., Amsterdam (NL)

(*) Notice: Subject to any disclaimer, the term of this patent is extended or adjusted under 35 U.S.C. 154(b) by 61 days.

(21) Appl. No.: 15/381,516

(22) Filed: Dec. 16, 2016

(65) Prior Publication Data

US 2018/0175883 A1 Jun. 21, 2018

(51) Int. Cl.
 *H03M 13/09* (2006.01)
 *G06F 11/10* (2006.01)
 *H03M 13/00* (2006.01)

(52) U.S. Cl.
 CPC ....... *H03M 13/091* (2013.01); *G06F 11/1004* (2013.01); *H03M 13/6505* (2013.01)

(58) Field of Classification Search
 CPC ............ H03M 13/091; H03M 13/6505; G06F 11/1004
 See application file for complete search history.

(56) References Cited

U.S. PATENT DOCUMENTS

| 6,029,186 A * | 2/2000 | DesJardins | H03M 13/091 708/492 |
| 6,802,038 B1 * | 10/2004 | Yu | H03M 13/451 714/758 |
| 8,539,326 B1 * | 9/2013 | Nethercot | G06F 11/10 707/699 |
| 2015/0318867 A1 * | 11/2015 | Wiley | H03M 13/091 714/807 |

OTHER PUBLICATIONS

Sun, et al: "A Table-Based Algorithm for Pipelines CRC Calculation," IEEE International Conference on Communications (ICC), 2010.
Walma: "Pipelined Cyclic Redundancy Check (CRC) Calculation," Proceedings of 16th International Conference on Computer Communications and Networks, 2007. ICCCN 2007.

* cited by examiner

*Primary Examiner* — April Y Blair
*Assistant Examiner* — Rong Tang
(74) *Attorney, Agent, or Firm* — Crowe & Dunlevy

(57) ABSTRACT

CRC generation circuitry includes a lookup-table storing N-bit CRC values for M one-hot data frames. N AND gates for each bit of a M-bit data frame receive that bit of the M-bit data frame and a different bit of a N-bit CRC value from the lookup-table corresponding to a position of the bit in the M-bit data frame. N exclusive-OR gates each receive output from one of the N AND gates for each bit of the M-bit data frame. The N exclusive-OR gates generate a final N-bit CRC value for the M-bit data frame. The CRC value is therefore generated with a purely combinational circuit, without clock (Continued)

cycle latency. Area consumption is small due to the small lookup-table, which itself permits use of any generator polynomial, and is independent of the width of the received data frame. This device can also generate a combined CRC for multiple frames.

7 Claims, 5 Drawing Sheets

PARALLEL PIPELINE LOGIC CIRCUIT FOR GENERATING CRC VALUES UTILIZING LOOKUP TABLE

TECHNICAL FIELD

This disclosure is related to the field of generating cyclic redundancy check (CRC) values for use in error detection in data communication, and in particular, to an area efficient, low latency, logic circuit for generating CRC values using a lookup table and being capable of parallel pipeline operation.

BACKGROUND

A cyclic redundancy check (CRC) is an error-detecting code commonly used in digital networks and storage devices to detect accidental changes to raw data. Blocks of data entering these systems have a short check value attached, based on the remainder of a polynomial division of their contents. On retrieval, the calculation is repeated and, in the event the check values do not match, corrective action can be taken against data corruption.

The term CRC is used because the check (data verification) value is a redundancy (it expands the message without adding information), and the CRC algorithm is based on cyclic codes. CRCs widely used in data communications because they are simple to implement in binary hardware, easy to analyze mathematically, and because they are particularly good at detecting common errors caused by noise in transmission channels. Because the check value has a fixed length, the function that generates it is occasionally used as a hash function.

A CRC is called an N-bit CRC when its check value is n bits long. Larger bit CRCs have a variety of advantages, although they also have drawbacks in the larger amount of computational power used in generation. The design of CRC generation circuits that do not consume an undesirable amount of area, operate without an undesirable amount of latency, and that can keep up with the ever increasing bandwidths of data communications is ever a challenge. Therefore, further development in this area is desired.

SUMMARY

This summary is provided to introduce a selection of concepts that are further described below in the detailed description. This summary is not intended to identify key or essential features of the claimed subject matter.

Disclosed herein is a method including steps of a) storing M, N-bit cyclic redundancy check (CRC) values for M one-hot encoded data frames in a lookup table, b) performing a logical AND operation between each bit of a M-bit data frame and a corresponding one of the M, N-bit CRC values so as to produce N AND values for each bit of the M-bit data frame, and c) performing an exclusive-OR between the N AND values for each bit of the M-bit data frame so as to produce a final N-bit CRC value for the M-bit data frame.

Steps b) and c) may be performed for a first M-bit data frame to produce a final N-bit CRC value for the first M-bit data frame. The method may also include performing steps b) and c) for a second M-bit data frame to produce a final N-bit CRC value for the second M-bit data frame, appending M-N zeroes to the final N-bit CRC value for the first M-bit data frame to produce an appended CRC value having M bits, and performing steps b) and c) for the appended CRC value having M bits to produce an intermediate CRC value. An exclusive-OR between the final CRC value for the second M-bit data frame and the intermediate CRC value may be performed to produce a combined CRC value for the first and second M-bit data frames.

Steps b) and c) may be performed for a first M-bit data frame to produce a final N-bit CRC value for the first M-bit data frame. The method may also include performing steps b) and c) for a second M-bit data frame to produce a final N-bit CRC value for the second M-bit data frame, performing steps b) and c) for the N-bit CRC value for the first M-bit data frame to produce an intermediate CRC value, and performing an exclusive-OR between the final CRC value for the second M-bit data frame and the intermediate CRC value to produce a combined CRC value for the first and second M-bit data frames.

The method may include receiving a plurality of payloads in parallel, with each payload comprising a plurality of M-bit data frames. For each of the plurality of payloads, a step of d) may be performed that includes in parallel, performing steps b) and c) for a first M-bit data frame of that payload to produce a final N-bit CRC value for that first M-bit data frame. For each of the plurality of payloads in parallel, a step of e) may be performed that includes performing steps b) and c) for a second M-bit data frame of that payload to produce a final N-bit CRC value for that second M-bit data frame, and performing steps b) and c) for the final N-bit CRC value for the first M-bit data frame to produce an intermediate CRC value, and performing an exclusive-OR between the final N-bit CRC value for that second M-bit data frame and the intermediate CRC value to produce a combined CRC value for those first and second M-bit data frames.

The method may include receiving a plurality of payloads in parallel, with each payload comprising a plurality of M-bit data frames. For each of the plurality of payloads, a step of d) may be performed that includes in parallel, performing steps b) and c) for a first M-bit data frame of that payload to produce a final N-bit CRC value for that first M-bit data frame. For each of the plurality of payloads in parallel, a step of e) may be performed that includes performing steps b) and c) for a second M-bit data frame of that payload to produce a final N-bit CRC value for that second M-bit data frame, appending M–N zeroes to the final N-bit CRC value for that first M-bit data frame to produce an appended CRC value having M bits, performing steps b) and c) for the appended CRC value having M bits to produce an intermediate CRC value, and performing an exclusive-OR between the final CRC value for the second M-bit data frame and the intermediate CRC value to produce a combined CRC value for the first and second M-bit data frames.

Each of the M one-hot encoded data frames may include only one bit having a value of one. The lookup table may have a size of M×N bits. The method may be implemented in discrete logic circuits in a specifically and specially programmed field programmable gate array (FPGA).

An electronic device aspect disclosed herein includes a memory including a lookup table storing N-bit cyclic redundancy check (CRC) values for M one-hot encoded data frames. There are N AND gates for each bit of a received M-bit data frame configured to each receive as input that bit of the received M-bit data frame and a different bit of a N-bit CRC value from the lookup table corresponding to a position of that bit in the received M-bit data frame, with N being less than M. N exclusive-OR gates are each configured to receive as input, output from one of the N AND gates for each bit of the received M-bit data frame. The N exclusive- OR gates are each collectively configured to generate a final N-bit CRC value for the received M-bit data frame.

The N AND gates and the N exclusive-OR gates may define a first logic circuit coupled to the memory. A second logic circuit may be coupled to the memory and may be defined by N AND gates for each bit of a received M-bit data frame configured to each receive as input that bit of the received M-bit data frame and a different bit of a N-bit CRC value from the lookup table corresponding to the received M-bit data frame, and N exclusive-OR gates each configured to receive as input, output from one of the N AND gates for each bit of the received M-bit data frame. The N exclusive-OR gates may be collectively configured to generate a final N-bit CRC value for the received M-bit data frame.

A multiplexer may have a first input coupled to receive the final N-bit CRC value for the received M-bit data frame received by the second logic circuit, and a second input coupled to a logic low voltage. N exclusive-OR gates may each be configured to receive as input output from the multiplexer and a different bit of the final N-bit CRC value for the received M-bit data frame received by the first logic circuit. These N exclusive-OR gates are collectively configured to generate a combined N-bit CRC value for the first and second M-bit data frames received by the first logic circuit.

A shifter may be coupled to a collective output of the N exclusive-OR gates generating the combined N-bit CRC value and configured to append M−N zeroes to the output thereof and send the appended output to be received by the second logic circuit as its M-bit data frame.

A first register may have an input coupled to the collective output of the N exclusive-OR gates generating the final N-bit CRC value for the M-bit data frame received by the first logic circuit and an output coupled to the N exclusive-OR gates, and a second register may have an input coupled to the collective output of the N exclusive-OR gates generating the final N-bit CRC value for the M-bit data frame received by the second logic circuit and an output coupled to the first input of the multiplexer.

DETAILED DESCRIPTION

The present description is made with reference to the accompanying drawings, in which example embodiments are shown. However, many different embodiments may be used, and thus the description should not be construed as limited to the embodiments set forth herein. Rather, these embodiments are provided so that this disclosure will be thorough and complete.

Described herein is a logic circuit implemented on special purpose hardware for generating CRC-n values of individual data frames, or of payloads comprised of multiple data frames.

The Inventors have found that, contrary to conventionally known techniques, determining the CRC-n value of a data frame D of a width m using a lookup table does not require a lookup table storing CRC-n values of all possible combinations of the data frame with the width m, which would be $2^m$ combinations. Rather, the Inventors have found that using a lookup table storing the CRC-n of m one-hot encoded data frames, the CRC of any m bit wide data frame can be determined. It should be understood that "one hot" means that the data frame contains a single bit having a value of 1 while the rest of the bits have a value of 0.

Consider an m bit wide data frame D which can be represented as a polynomial D(x) of degree m−1 whose coefficients are the bit values of D. This can be mathematically represented as:

$$D(x)=D_{m-1}x^{m-1}+D_{m-2}x^{m-2}+D_{m-2}x^{m-3}\ldots+D_1x+D_0$$

Thus, the CRC-n value for data frame D can be calculated as:

$$CRC(D)=CRC([D_{m-1}D_{m-2}\ldots D_0])_{1\times m}=CRC(D\times I)$$

where I is an identity matrix. This yields:

$$CRC(D_{m-1}I_1+D_{m-2}I_2+\colon\colon\colon+D_0I_m)$$

where $I_1, I_2 \ldots I_m$ are subsets of Identity matrix I. These identity matrices are, for example:

$I_1=[1\ 0\ 0\ \ldots\ 0]_{1\times m}$,
$I_2=[0\ 1\ 0\ \ldots\ 0]_{1\times m}$
$I_m=[0\ 0\ 0\ \ldots\ 1]_{1\times m}$ $CRC(D_{m-1}I+D_{m-2}\ I_2+\colon\colon\colon+D_0I_m)$ can be expanded as:

$$CRC(D_{m-1}I_1)+CRC(D_{m-2}I_2)+\colon\colon\colon+CRC(D_0I_m).$$

Thus, the CRC-n value of a data packet D of m bits can be calculated as:

$$CRC(D)=D_{m-1}CRC(I_1)+D_{m-2}CRC(I_2)+\colon\colon\colon+D_0CRC(I_m)$$

where $D=[D_{m-1}\ D_{m-2}\ \ldots\ D_0]$

Figure 1:
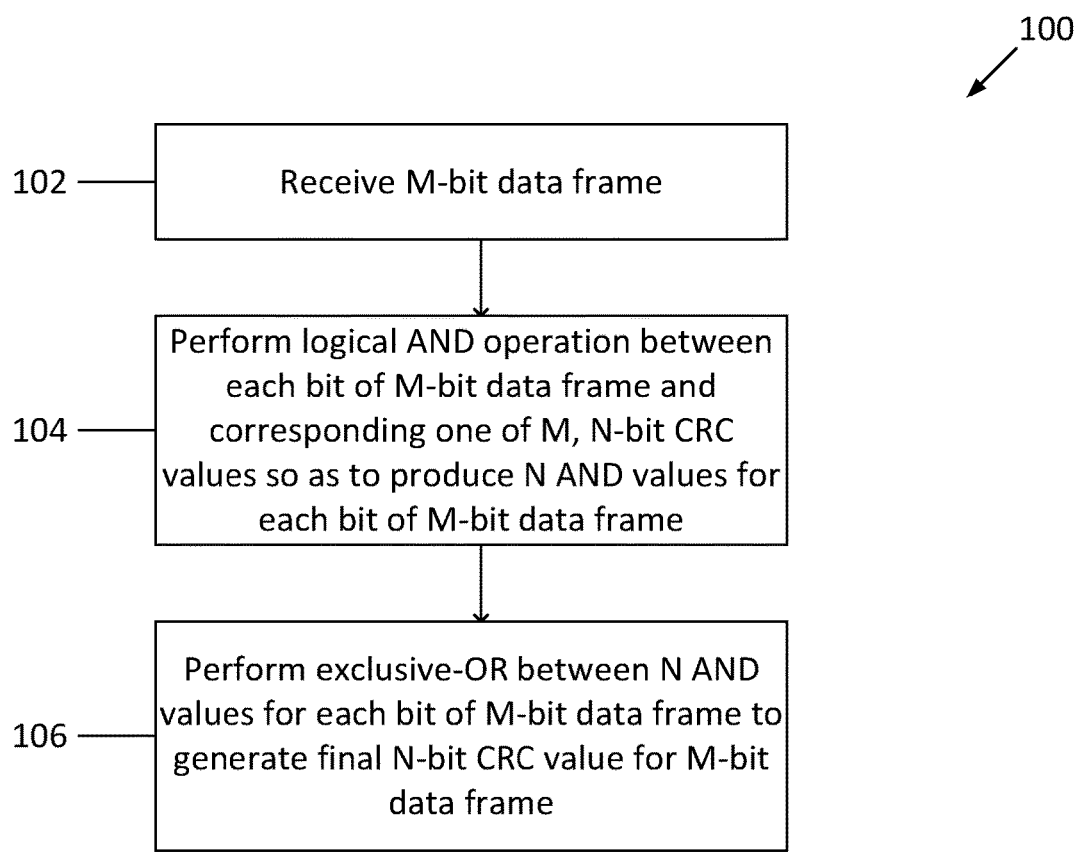
FIG. 1 is a flowchart of a method of generating CRC values for a single data frame in accordance with this disclosure.

In simpler terms, with reference to flowchart 100 of FIG. 1, calculation of the CRC-n value for a data frame D of m bits is now described. Initially, the m-bit data frame is received (Block 102). Thereafter, a logical AND operation between each bit of the M-bit data frame and a corresponding one of the M, N-bit CRC-n values from the lookup table is performed to produce N AND values for each bit of the M-bit data frame (Block 104).

In greater detail, each bit of the first stored CRC-n value corresponding to a first one-hot encoded data frame is logically ANDed with a most significant bit (MSB) of the M-bit data frame, each bit of a second stored CRC-n value corresponding to a second one-hot encoded data frame is logically ANDed with a second to most significant bit of the M-bit data frame, and so on and so forth until each bit of a last stored CRC-n value corresponding to a last one-hot encoded data frame is logically ANDed with a least significant bit (LSB) of the M-bit data frame.

Stated another way, the CRC-n values of m one-hot encoded data frames are multiplied by corresponding bits of the M-bit data frame.

As stated, this produces N AND values for each bit of the M-bit data frame. The N AND values for each bit are exclusively ORed to generate a final N-bit CRC value for the M-bit data frame (Block 106). Stated another way, the multiplied values are XORed to get the final N-bit CRC value for the M-bit data frame.

In greater detail, each LSB N AND value for each bit is exclusively ORed together to produce a LSB bit of the final N-bit CRC value for the M-bit data frame, each second least significant N AND value for each bit is exclusively ORed together to produce a second LSB of the final N-bit CRC value for the M-bit data frame, and so on and so forth until each most significant N AND value for each bit is exclusively ORed together to produce a MSB of the final N-bit CRC value for the M-bit data frame.

Figure 2:
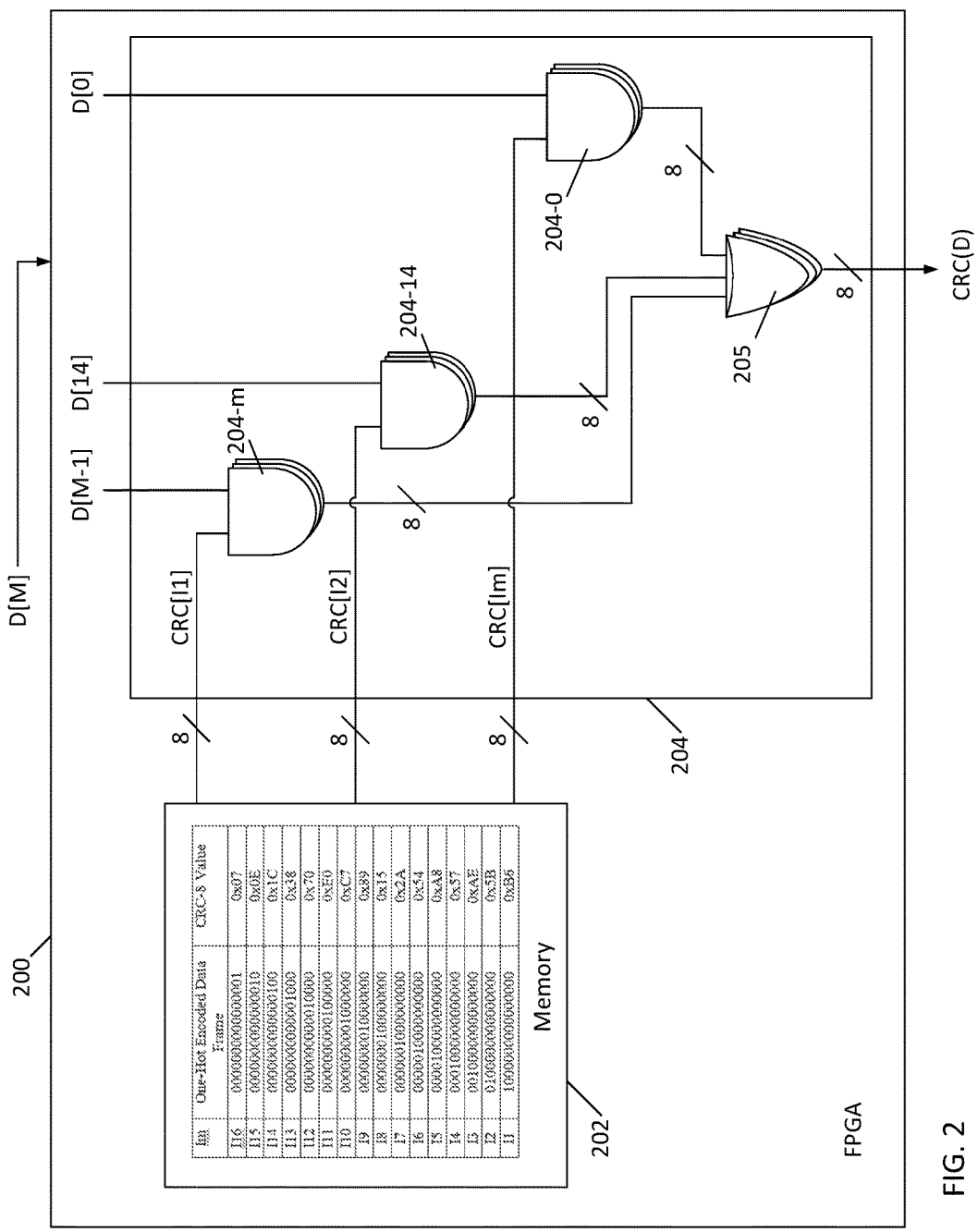
FIG. 2 shows the specific hardware implementation of the method of FIG. 1.

With reference to FIG. 2, a logic circuit 200 for generating the N-bit CRC value for a M-bit data frame is now described. The logic circuit 200 includes a memory 202 storing the lookup table, which has a size of N×M. The lookup table stores the N-bit CRC values for each of M one-hot data frames, with it being understood that "one hot" means that the data frame contains a single bit having a value of 1 while the rest of the bits have a value of 0. The lookup table illustrated as being stored in the memory 202 is for a CRC-8 computation for a 16 bit data frame. The CRC-n data are stored and ordered as CRC[$I_1$] to CRC[In].

Coupled to the memory 202 is a logic array 204. Logic array 204 includes N AND gates for each bit of the data frame D, each of those AND gates receiving as input the bit of the data frame D and a different bit of a corresponding CRC value from the lookup table. Thus, as shown, there are N AND gates 204-$m$ for the mth bit of data frame D, N AND gates 204-14 for the second to MSB of data frame D, and this repeats as will be understood, ending with N AND gates 204-0 for the LSB of the data frame D.

The outputs of each AND gate corresponding to a given CRC bit position are fed to an exclusive OR (XOR) gate 205, and there are N such XOR gates 205. Thus, by assembling the outputs of the XOR gates 205, the CRC-n value for the data frame D has been generated.

In some applications, not only is the CRC of a single data frame calculated, but the collective CRC of all data frames in a payload is calculated. The Inventors have found the above logic circuitry to be suitable for this task as well, and have found that to compute a combined CRC value of multiple data frames in a payload, the CRC value of a first data frame is computed, then CRC of its shifted value is computed. The CRC of the shifted value is then XORed with the CRC value of a next data frame. The result is CRC of first two data frames, and this operation can be repeated until the end of the data payload is reached.

Mathematically, the CRC of a payload of two M-bit data packets D1 and D2 can be represented as:

$$CRC([D1D2])=CRC([D1_{1\times m}O_{1\times m}]+D2_{1\times m})$$

This can be calculated as follows:

$$CRC[(B_{1\times 2m})]=CRC([D_{1\times m}O_{1\times m}])$$

where, $B=[D_{1\times m}O_{1\times m}]$, and where, $O=[0\ 0\ 0\ 0\ 0\ \ldots\ 0]_{1\times m}$
Thus:

$$B(x)=D(x)x^m$$

Therefore:

$$\begin{aligned} CRC(B(x)) &= B(x)x^n \bmod G(x) \\ &= D(x)x^m x^n \bmod G(x) \\ &= x^m[D(x)x^n \bmod G(x)] \bmod G(x) \\ &= x^m CRC(D(x)) \bmod G(x) \\ &= x^{m-n} CRC(D(x)) x^n \bmod G(x) \\ &= CRC[CRC(D(x))x^{(m-n)}] \end{aligned}$$

Therefore:

$$CRC(B)=CRC[CRC(D)_{1\times n}O_{1\times(m-n)}]$$

Consequently:

$$CRC([D1D2])=CRC([D1_{1\times m}O_{1\times m}]+D2_{1\times m})=CRC(B)+CRC(D2)=CRC[CRC(D)_{1\times n}O_{1\times(m-n)}]+CRC(D2)$$

Thus, as stated, the CRC for a payload comprised of data frames D1 and D2 can be mathematically represented as:

$$CRC([D1D2])=CRC([CRC(D1)_{1\times n}O_{1\times(m-n)}])+CRC(D2)$$

Figure 3:
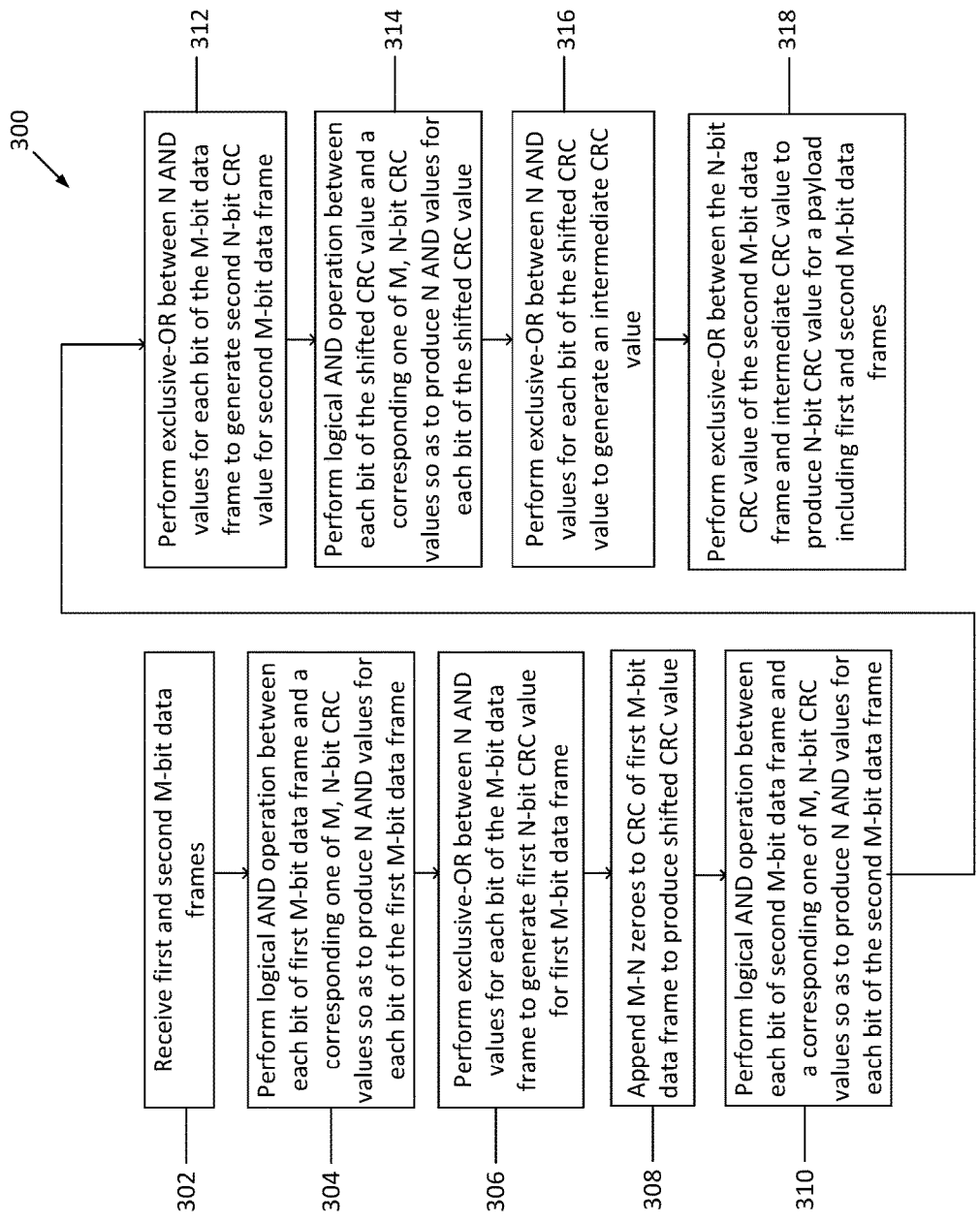
FIG. 3 is a flowchart of a method of generating CRC values for a data payload comprised of multiple data frames in accordance with this disclosure.

In simpler terms, with reference to flowchart 300 of FIG. 3, the calculation of a CRC value for a data payload comprised of multiple data frames is now described. To start, first and second M-bit data frames are received (Block 302). Thereafter, a logical AND operation between each bit of the first M-bit data frame and a corresponding one of the M, N-bit CRC-n values from the lookup table is performed to produce N AND values for each bit of the first M-bit data frame (Block 304). This proceeds as described above with reference to the example of computing a CRC value for a single M-bit data frame.

The N AND values for each bit are then exclusively ORed to generate a final N-bit CRC value for the first M-bit data frame (Block 306). Thereafter, M-N zeroes are appended to the N-bit CRC value for the first M-bit data frame so as to produce an M-bit shifted CRC value (Block 308).

Then, a logical AND operation between each bit of the second M-bit data frame and a corresponding one of the M, N-bit CRC-n values from the lookup table is performed to produce N AND values for each bit of the second M-bit data frame (Block 310). The N AND values for each bit are then exclusively ORed to generate a final N-bit CRC value for the second M-bit data frame (Block 312).

A logical AND operation between each bit of the shifted CRC value and a corresponding one of the M, N-bit CRC-n values from the lookup table is performed to produce N AND values for each bit of the shifted CRC value (Block 314). The N AND values for each bit are then exclusively ORed to generate an intermediate CRC value (Block 316). An exclusive-OR is then performed between the N-bit CRC value for the second M-bit data frame and the intermediate CRC value so as to produce the N-bit CRC value for the payload comprised of the first and second M-bit data frames (Block 318).

Figure 4:
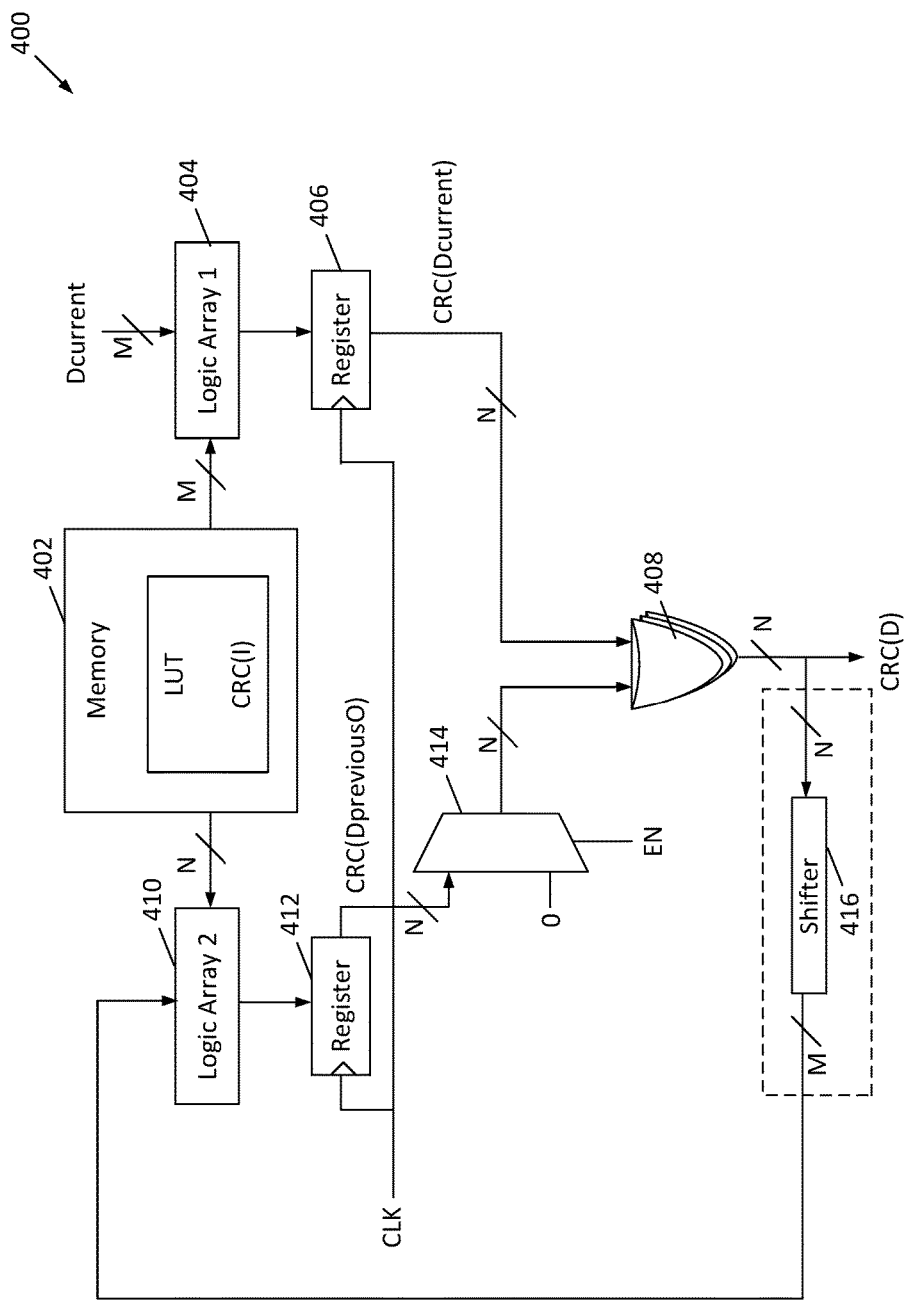
FIG. 4 shows the specific hardware implementation of the method of FIG. 3.

The circuitry 400 used to implement this functionality is now described with additional reference to FIG. 4. The circuit 400 includes a memory 402 storing as a lookup table, as described above with reference 202 of FIG. 2. A first logic array 404, identical in circuitry and function to the first logic array 204 described above in FIG. 2, is coupled to receive the M bits of a current M-bit data frame, as well as M CRC values of M one-hot data frames, as stored in the lookup table. The first logic array 404 provides its output to register 406, which provides the N bits of its output to the N exclusive-OR gates 408. An optional shifter 416 receives N bits of output collectively from the N exclusive-OR gates 408, and provides its output of M bits to a second logic array 410.

The second logic array 410 receives a M-bit data frame from the shifter 416, as well as N CRC values of N one-hot data frames, as stored in the lookup table. That is, the second logic array 410 receives a subset of N of the CRC values stored in the lookup table. The second logic array 410 provides its output to register 412, which in turn provides its N bit output to multiplexer 414. Multiplexer 414 multiplexes the N bit output from register 412 together with a logic low to the N exclusive OR gates 408.

Registers 406 and 412 are clocked by a clock signal, and multiplexer 414 is controlled by enable signal EN.

Operation of the circuit 400 will now be described. The logic array 404 receives a current data frame D and generates and outputs the CRC value thereof (as described above in detail) to register 406. Upon triggering by a first clock CLK edge, the register 406 outputs that CRC value, denoted as CRC(Dcurrent) as a N bit signal to exclusive-OR gates 408. In addition, during the first clock CLK edge, the enable signal EN causes the multiplexer 414 to output a N-bit signal of zeroes to the exclusive-OR gates 408. Thus, the exclusive-OR gates 408 collectively outputs the N-bit CRC (Dcurrent).

Optional shifter 416 may append M−N bits to CRC (Dcurrent) to turn it into a M-bit value, and feeds the result to logic array 410. The logic array 410 may receive the M-bit CRC value of Dcurrent, determine the CRC value thereof, and output that CRC value as $CRC[CRC(Dprevious)_{1 \times n} O_{1 \times (m-n)}]$ as a N-bit signal to register 412.

Upon triggering by a second clock CLK edge, the register 412 outputs $CRC[CRC(Dprevious)_{1 \times n} O_{1 \times (m-n)}]$ to the exclusive-OR gates 408. By this time, a new data frame Dcurrent has been received by logic array 404, and the CRC value thereof has been determined and written to register 406. Upon triggering by the second clock CLK edge, the register 406 outputs the CRC of the new data frame CRC (Dcurrent) to the exclusive-OR gates 408. The exclusive-OR gates 408 therefore perform an exclusive-OR operation between CRC(Dcurrent) and $CRC[CRC(Dprevious)_{1 \times n} O_{1 \times (m-n)}]$, which yields the CRC value for a payload comprised of Dcurrent and DPrevious.

It should be appreciated that, in cases where the payload is comprised of more than two data frames, the operation described above can simply be repeated until the output of the exclusive-OR gates 408 is that of a CRC value for, collectively, each data frame of the payload.

Figure 5:
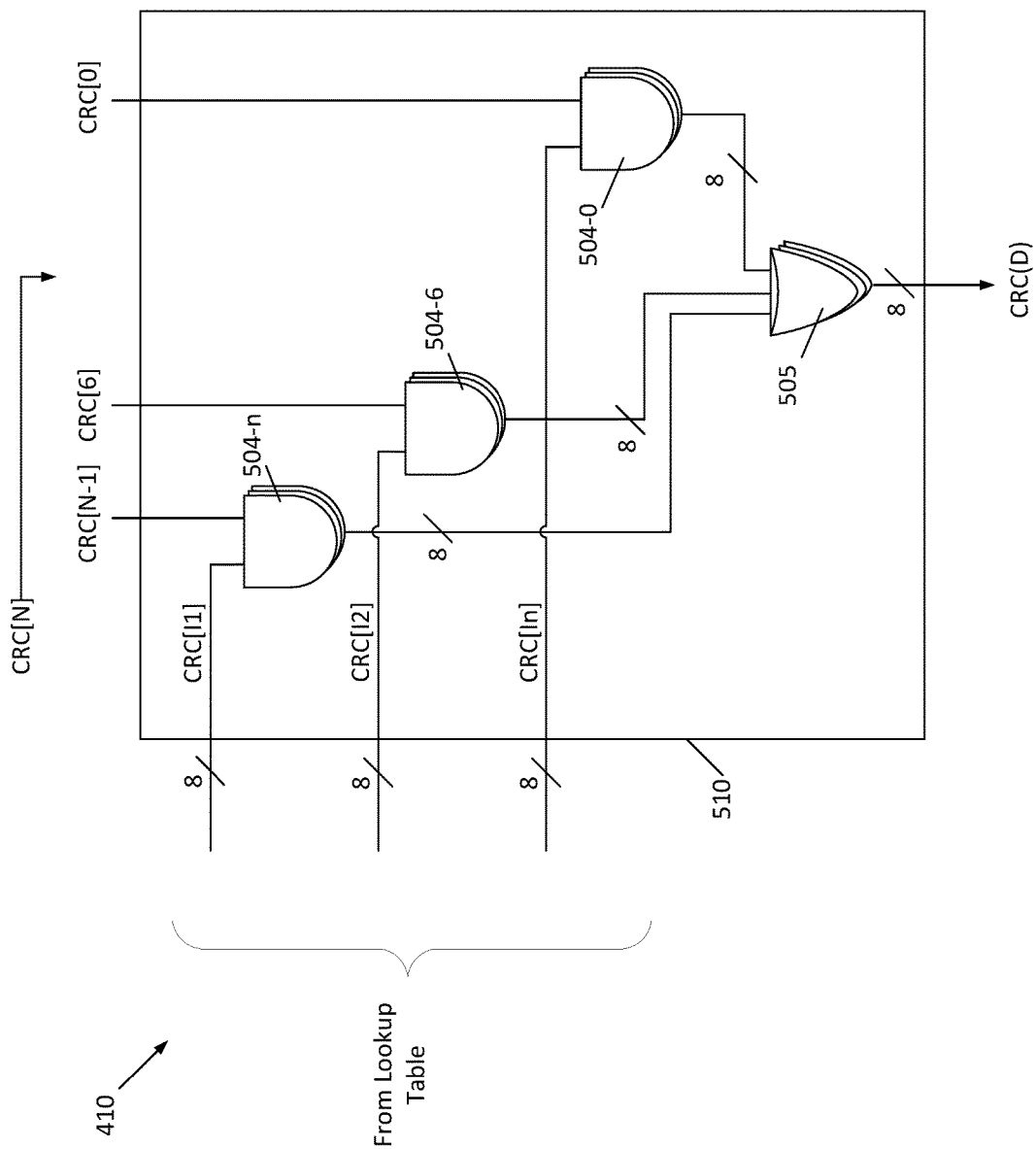
FIG. 5 is a schematic block diagram of the second logic circuit of FIG. 4

With additional reference to FIG. 5, the logic array 410 is now described. Like logic array 404, logic array 410 is an array of AND gates and exclusive-OR gates. Logic array 410 includes N AND gates for each bit of $CRC(Dprevious)_{1 \times n} O_{1 \times (m-n)}$, each of those AND gates receiving as input the bit of the CRC value and a different bit of a corresponding CRC value from the lookup table. Thus, as shown, there are N AND gates 504-n for the Nth bit of $CRC(Dprevious)_{1 \times n} O_{1 \times (m-n)}$, N AND gates 404-6 for the second to MSB of $CRC(Dprevious)_{1 \times n} O_{1 \times (m-n)}$, and this repeats as will be understood, ending with N AND gates 504-0 for the first bit of $CRC(Dprevious)_{1 \times n} O_{1 \times (m-n)}$.

The outputs of each AND gate corresponding to a given CRC bit position are fed to an exclusive OR (XOR) gate 505, and there are N such XOR gates 505. Thus, by assembling the outputs of the XOR gates 505, the CRC value for $CRC(Dprevious)_{1 \times n} O_{1 \times (m-n)}$ has been generated.

As per the above explanation of the operation of the circuit 400, including the shifter 416, it would seem that logic array 410 would have a size of M×M. However, since the least significant M−N bits are appended as zeroes which, when multiplied by a corresponding M−N uppermost CRC values from the lookup table, the result would be zero. Therefore, these bits may be ignored, the shifter 416 may not be used, and the CRC(Dprevious) values from logic array 404 and the N lowermost CRC values from the lookup table may be given as input to the AND gates 504-0 to 504-n of logic array 410, as shown in FIG. 5, and the logic array 410 may have a size of N×N, rather than M×M like the logic array 404.

This makes the area of logic array 410 constant, independent of data frame width M. Hence, there is a negligible gain in area overhead with increase in data frame width M. In addition, the 2:1 Mux makes this architecture flexible to select CRC computations of single data frame or combined CRC computations of complete data frames in a payload.

It should be appreciated that multiple instances of the circuit 400 may be stacked in parallel, but with only one memory 402 common to all of such circuits. Thus, one memory 402 with one lookup table can service any number of such circuits 400, saving space.

Thus, described herein has been a single cycle latency, parallel CRC computation logic circuit capable of working with any generator polynomial degree and any arbitrary size of the input message. These logic circuits are particularly area efficient as the size thereof scales linearly with the data width of the data frames, which means that they are scalable to any size desired.

The described logic circuits can be implemented via discrete separate logic gates, via logic gates integrated together into a semiconductor substrate, via an application specific integrated circuit, or via a specifically programmed and specially purposed programmable logic array, field programmable gate array, or programmable logic controller. For example, the described logic circuits may be implemented in a Virtex-6 FPGA or on a 45-nm CMOS standard cell ASIC.

These logic circuits are particularly suitable for implementation not only for low latency, high speed interfaces such as PCIe, Ethernet or MIPI LLI, but also for mobile applications due to low power consumption. In addition, depending on the availability of hardware resources or throughput requirements, the described logic circuits provide flexibility to a system designer to balance between the strict constraints and the payoffs. However these payoffs are particularly advantageous since the hardware requirements scale linearly with the size of the input payload.

Many modifications and other embodiments will come to the mind of one skilled in the art having the benefit of the teachings presented in the foregoing descriptions and the associated drawings. Therefore, it is understood that various modifications and embodiments are intended to be included within the scope of the appended claims.

The invention claimed is:

1. An electronic device, comprising:
   a data interface carrying bits of M one-hot encoded data frames, wherein each of the M one-hot encoded data frames includes only one bit having a value of one;
   a memory including a lookup table storing N-bit cyclic redundancy check (CRC) values, the N-bit CRC values being for the M one-hot encoded data frames, the memory having N outputs for each of the N-bit CRC values;
   N AND gates for each bit of a received M-bit data frame, each of the N AND gates for each bit of the received M-bit data frame having a first input coupled to the data interface to receive that bit of the received M-bit data frame, and having a second input coupled to a corresponding one of the N outputs of the memory to receive a different bit of a N-bit CRC value from the lookup table corresponding to a position of that bit in the received M-bit data frame; and N exclusive-OR gates, each of the N-exclusive-OR gates having an input coupled to an output of one of the N AND gates for each bit of the received M-bit data frame;

wherein the N exclusive-OR gates have outputs that collectively output a final N-bit CRC value for the received M-bit data frame; and wherein N is less than M, with N being a first integer, and M being a second integer greater than the first integer.

2. The electronic device of claim 1, wherein the N AND gates and the N exclusive-OR gates define a first logic circuit coupled to the memory; and further comprising:

a second logic circuit coupled to the memory and defined by:

N AND gates for each bit of a received M-bit data frame configured to each receive as input that bit of the received M-bit data frame and a different bit of a N-bit CRC value from the lookup table corresponding to a position of the bit in the received M-bit data frame, wherein N is less than M; and N exclusive-OR gates each configured to receive as input, output from one of the N AND gates for each bit of the received M-bit data frame;

wherein the N exclusive-OR gates are collectively configured to generate a final N-bit CRC value for the received M-bit data frame.

3. The electronic device of claim 2, further comprising:

a multiplexer having a first input coupled to receive the final N-bit CRC value for the received M-bit data frame received by the second logic circuit, and a second input coupled to a logic low voltage; and N exclusive-OR gates each configured to receive as an input from output of the multiplexer and a different bit of the final N-bit CRC value for the received M-bit data frame received by the first logic circuit, wherein these N exclusive-OR gates are collectively configured to generate a combined N-bit CRC value for the first and second M-bit data frames received by the first logic circuit.

4. The electronic device of claim 3, further comprising a shifter coupled to a collective output of the N exclusive-OR gates generating the combined N-bit CRC value and configured to append M-N zeroes to the output thereof and send the appended output to be received by the second logic circuit as its M-bit data frame.

5. The electronic device of claim 4, further comprising a first register having an input coupled to the collective output of the N exclusive-OR gates generating the final N-bit CRC value for the M-bit data frame received by the first logic circuit and an output coupled to the N exclusive-OR gates, and a second register having an input coupled to the collective output of the N exclusive-OR gates generating the final N-bit CRC value for the M-bit data frame received by the second logic circuit and an output coupled to the first input of the multiplexer.

6. The electronic device of claim 1, wherein the lookup table has a size of M×N bits.

7. The electronic device of claim 1, wherein the N AND gates and the N exclusive-OR gates are implemented in a specifically and specially programmed field programmable gate array (FPGA).

* * * * *